United States Patent
Suh et al.

(10) Patent No.: US 6,573,174 B2
(45) Date of Patent: Jun. 3, 2003

(54) METHOD FOR REDUCING SURFACE DEFECTS OF SEMICONDUCTOR SUBSTRATES

(75) Inventors: Dae-Won Suh, Seoul (KR); Nae-Hak Park, Seoul (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/848,543

(22) Filed: May 4, 2001

(65) Prior Publication Data

US 2002/0036351 A1 Mar. 28, 2002

(30) Foreign Application Priority Data

Sep. 22, 2000 (KR) .......................... 2000-55802

(51) Int. Cl.⁷ ...................... H01L 21/4763; H01L 21/44
(52) U.S. Cl. ...................... 438/637; 438/672; 438/692
(58) Field of Search ................... 438/637, 672, 438/692

(56) References Cited

U.S. PATENT DOCUMENTS 4,936,950 A * 6/1990 Doan et al. ................ 216/18
6,153,526 A * 11/2000 Shih et al. ................. 216/38
6,380,087 B1 * 4/2002 Gupta et al. ............... 438/692

FOREIGN PATENT DOCUMENTS

TW             406040 A  * 9/2000 .............. B24B/7/20

* cited by examiner

Primary Examiner—William David Coleman
(74) Attorney, Agent, or Firm—Fleshner & Kim, LLP

(57) ABSTRACT

A method for reducing surface defects of a semiconductor substrate comprising selectively etching an insulation film formed on a semiconductor substrate and forming a contact hole, forming a conductive layer in a contact hole and on the upper surface of the insulation film, performing a Chemical Mechanical Polishing process on the conductive layer to expose the upper surface of the insulation film and forming a conductive layer plug in the contact hole, forming an oxide film on the upper surface of the conductive plug, and washing the conductive layer plug and the surface of the insulation film. In order to reduce surface defects of a semiconductor substrate, an oxide film is formed on the surface of the semiconductor substrate during the Chemical Mechanical Polishing process or after the Chemical Mechanical Polishing process, so that the efficiency of the post-washing process is heightened and the surface defects of the substrate is reduced.

10 Claims, 1 Drawing Sheet

METHOD FOR REDUCING SURFACE DEFECTS OF SEMICONDUCTOR SUBSTRATES

BACKGROUND OF THE INVENTION

1. Field of the Invention

The present invention relates to a method for fabricating a semiconductor substrate.

2. Background of the Related Art

As semiconductor devices are becoming more highly integrated and their design rules are changed, the aspect ratio of a contact hole or a via hole has become larger, thus decreasing the reliability of an interlayer contact. Accordingly, in order to improve the reliability in an interlayer contact, a plug is generally formed in a contact hole or in a via hole. The plug is generally formed in the contact hole or in the via hole by etching an insulation layer to form a contact hole or a via hole, forming a conductive material layer on the upper surface of the insulation layer and in the contact hole or in the via hole, performing a Chemical Mechanical Polishing (CMP) process on the conductive material layer until the upper surface of the insulation layer is exposed and finally performing post-washing to remove residual particles produced during the Chemical Mechanical Polishing process.

However, the method for forming a plug of a semiconductor device has various problems. For example, after the Chemical Mechanical Polishing process is finished and before the post-washing begins, the semiconductor wafer is exposed to ambient air for a considerable time period. During this time, particles in the ambient air are adsorbed onto the upper surface of the semiconductor wafer, which degrades the efficiency of the post-washing process, as well as, increases the surface defects in the semiconductor substrate.

The particles of the ambient air are adsorbed onto the surface of the semiconductor substrate because after the Chemical Mechanical Polishing process is finished, the surfaces of the insulation layer and of the conductive layer are exposed to the ambient air, the surface of the insulation layer and the conductive layer is a polysilicon layer which is in a hydrophobic state. Accordingly, a rapid dry phenomenon occurs because of its hydrophobic state on the surface of the polysilicon layer, which causes the particle residue produced during the Chemical Mechanical Polishing process and the particles in the ambient air to be adsorbed onto the surface of the semiconductor substrate.

Thus, since the particles are adsorbed onto the surface of the semiconductor substrate, the post-washing process hardly removes the particles, thus degrading the efficiency of the post-washing process and increasing the surface defect of the semiconductor substrate.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a method for reducing surface defects of a semiconductor substrate.

Another object of the present invention is to change the surface of a semiconductor substrate from a hydrophobic to a hydrophilic state.

A further object of the present invention is to heighten the efficiency of the post-washing process.

To achieve these and other advantages and in accordance with the purpose of the present invention, as embodied and broadly described herein, there is provided a method for reducing surface defects of a semiconductor substrate including processing the surface of a semiconductor substrate by using a chemical solution between a Chemical Mechanical Polishing process and a post-washing process.

To achieve the above object, there is also provided a method for reducing surface defects of a semiconductor substrate including a step of oxidizing the surface of a semiconductor substrate between the Chemical Mechanical Polishing process and the post-washing process.

To achieve the above object, there is also provided a method for reducing surface defects of a semiconductor substrate including a step of performing the Chemical Mechanical Polishing process by adding a chemical solution as an additive to a slurry for the Chemical Mechanical Polishing process.

To further achieve the above object, there is also provided a method for reducing surface defects of a semiconductor substrate by selectively etching an insulation film formed on a semiconductor substrate and forming a contact hole, forming a conductive layer in a contact hole and on the upper surface of the insulation film, performing a Chemical Mechanical Polishing process on the conductive layer to expose the upper surface of the insulation film and forming a conductive layer plug in the contact hole, processing the upper surface of the conductive layer plug with a chemical solution and washing the conductive layer plug and the surface of the insulation film.

In the above method, in the step of processing the surface of the conductive layer plug with a chemical solution, the surface of the plug is changed from a hydrophobic state to a hydrophilic state.

In the above method, the step of forming the plug and the step of forming the oxide layer on the upper surface of the plug are simultaneously performed.

To achieve the above objects of the present invention in whole or in parts there is provided a method for reducing surface defects of a semiconductor substrate that includes selectively patterning an insulation film formed on a semiconductor substrate to form at least one contact hole, forming a conductive layer in the contact hole and on the insulation film, polishing the conductive layer to remove a portion of the conductive layer and expose a surface of the insulation film thus forming a conductive layer plug which remains in the contact hole, forming an oxide film on a surface of the conductive plug, and washing the oxide film and the insulation film.

To further achieve the above objects of the present invention in whole or in parts there is provided a method for reducing surface defects of a semiconductor substrate that includes selectively patterning an insulation film formed on an upper surface of a semiconductor substrate and forming a hole, forming a conductive layer in the hole and on an upper surface of the insulation film, performing a polishing process with slurry on the conductive layer to remove portions of the conductive layer to expose the upper surface of the insulating film and form a conductive layer plug which remains in the contact hole and also to simultaneously form an oxide film on the upper surface of the plug, and washing the upper surface of the conductive layer plug and of the insulation film.

To further achieve the above objects of the present invention in whole or in parts there is provided a semiconductor wafer with reduced surface defects that includes a semiconductor substrate, a selectively formed insulating layer with a hole, a first conductive layer formed in the hole, and an oxide film with a bottom surface adjacent to the upper surface of the first conductive layer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

FIGS. 1A through 1E illustrate a Chemical Mechanical Polishing process and a method for reducing surface defects of a semiconductor substrate in accordance with the present invention.

Figure 1A:
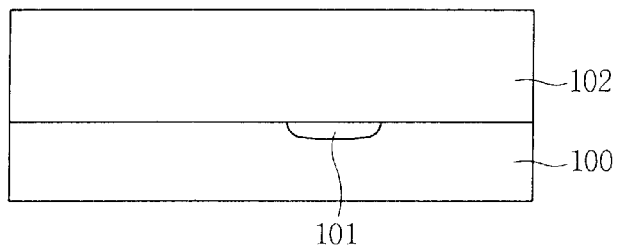
FIGS. 1A through 1E illustrate a Chemical Mechanical Polishing process and a method for reducing surface defects of a semiconductor substrate in accordance with a preferred embodiment of the present invention.

As shown in FIG. 1A, a semiconductor substrate 100 having a first conductive layer 101 or a region is formed. The first conductive layer 101 may be an impurity region formed in the semiconductor substrate 100 or a conductive film formed on the semiconductor substrate 100. Alternatively, this step may be omitted. An insulation layer 102 is formed on the upper surface of the conductive layer 101 and of the semiconductor substrate 100.

Figure 1B:
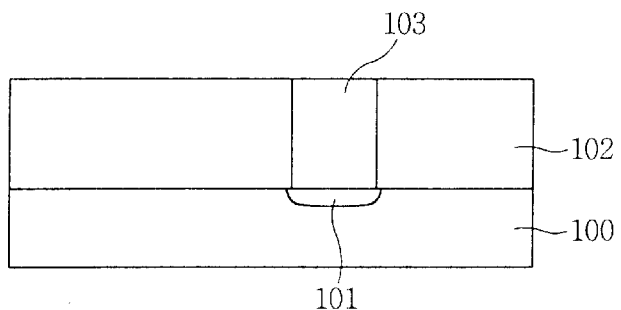
Figure 1C:
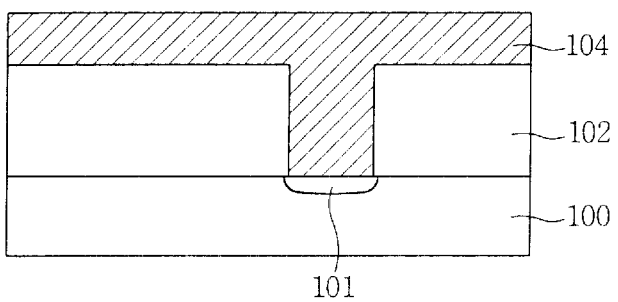

As shown in FIG. 1B, the insulation layer 102 is selectively etched to expose the upper surface of the first conductive layer 101, to thereby form a contact hole 103. As shown in FIG. 1C, a second conductive layer 104, such as a polysilicon, is formed in the contact hole 103 and on the upper surface of the insulation layer 102.

Figure 1D:
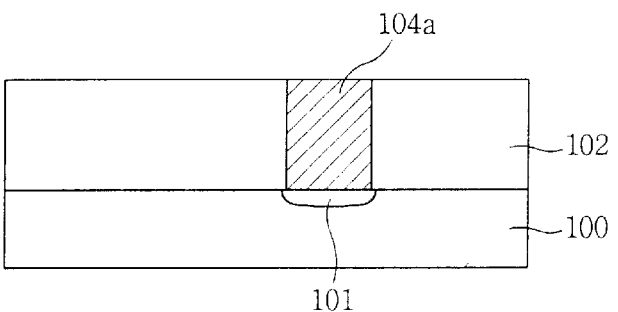

As shown in FIG. 1D, a Chemical Mechanical Polishing process is performed on the second conductive layer 104 until the upper surface of the insulation layer 102 is exposed. Resultantly, a plug 104a of the second conductive layer 104 is formed in the contact hole 103.

Figure 1E:
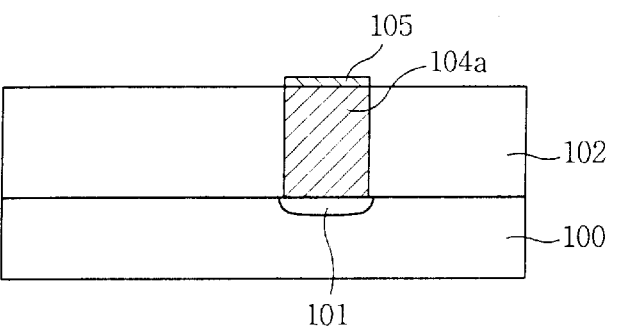

As shown in FIG. 1E, the entire upper surface of the wafer of the obtained structure as shown in FIG. 1D is washed with a chemical, to form an oxide film 105 on the upper surface of the plug 104a. The chemical solution may be a wet cleaning liquid wherein $NH_4OH$, $H_2O_2$ and $H_2O$ are mixed in the ratio of 1:1:5~1:2:7, having a temperature of 70~80° C. (hereinafter standard chemical or "SC-1)". This chemical solution effectively removes particles due to its high degree of oxidation.

Consequently, the semiconductor substrate, especially, the upper surface of the plug 104a, is changed from the hydrophobic state to the hydrophilic state, so that when the semiconductor substrate 100 is exposed in the ambient air, particles in the air are prevented from being absorbed onto the upper surface of the plug 104a.

And then, a post-washing process is performed to remove the-particles (not shown) attached on the surface of the semiconductor substrate 100 of FIG. 1E. At this time, since an oxide film is formed on the upper surface of the plug 104, the particles can be easily removed, resulting in an improved efficiency of the post-washing process and a reduction in the surface defects on the semiconductor substrate.

In order to oxidize the surface of the semiconductor wafer, a processing step for the surface of the semiconductor substrate by using the SC-1 chemical solution is added between the Chemical Mechanical Polishing process and the post-washing process.

Upon oxidation, the surface of the wafer is changed from the hydrophobic state to the hydrophilic state, so that the surface of the wafer is prevented from rapid drying, and accordingly, particles are not strongly adsorbed onto the surface of the wafer. Thus, the particles on the surface of the wafer are easily removed during the post-washing process, so that the efficiency of the post-washing process is heightened and the defects can be minimized.

In a second preferred embodiment of the present invention, a small quantity of SC-1 chemical solution is added to a slurry used in the Chemical Mechanical Polishing process of FIG. 1D, so that the surface of the semiconductor substrate is oxidized to be in a hydrophilic state at the same time while performing the Chemical Mechanical Polishing process. The Chemical Mechanical Polishing process refers to a method in which a polishing-object film is mechanically polished with an ultrafine abrasive such as silica, and at the same time, a chemical reaction is made thereon by using a chemical substance, thereby removing the polishing-object film.

Common slurries used in Chemical Mechanical Polishing processes are made of an ultrafine particle, such as $SiO_2$, suspended in a chemical solution such as KOH, or $NH_4OH$.

In the present invention, slurry for the Chemical Mechanical Polishing process of a polysilicon layer uses KOH as a stabilizer, in which silica having a particle size of about a few hundred nm is suspended, although other slurries could be used.

Chemical substances may be included in the slurry such as a dispersion agent for heightening dispersibility of particles of slurry, a suspension for mixing evenly the chemical solution, a defoaming agent for restraining air bubble from generating during the Chemical Mechanical Polishing process and removing it, a buffer solution for preventing a pH shock and an additive added for oxidizing, such as the SC-1 chemical solution.

Another embodiment of the present invention includes a semiconductor wafer with reduced surface defects comprising a semiconductor substrate, a selectively formed insulating layer with a contact hole, a first conductive layer between the insulating layer and the semiconductor substrate, wherein the first conductive layer is adjacent to the contact hole, a second conductive layer forming a plug in the contact hole and an oxide film with a bottom surface adjacent to the upper surface of the plug. Also, the upper surface of the plug and the upper surface of the insulating layer may be approximately the same height, or the width of the oxide film can be approximately the same width as the plug.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims. Many alternatives, modifications, and variations will be apparent to those skilled in the art. In the claims, means-plus-function clauses are intended to cover the structures described herein as performing the recited function and not only structural equivalents but also equivalent structures.

The foregoing embodiments and advantages are merely exemplary and are not to be construed as limiting the present invention. The present teaching can be readily applied to other types of apparatuses. The description of the present invention is intended to be illustrative, and not to limit the scope of the claims.

What is claimed is:

1. A method for reducing surface defects of a semiconductor substrate, comprising:

selectively patterning an insulation film formed on a semiconductor substrate to form at least one contact hole;

forming a conductive layer in the contact hole and on the insulation film;

polishing the conductive layer to remove a portion of the conductive layer and expose a surface of the insulation film thus forming a conductive layer plug which remains in the contact hole;

forming an oxide film on a surface of the conductive plug, wherein the oxide film is formed independently after the polishing of the conductive layer step; and washing the oxide film and the insulation film, wherein the conductive layer comprises polysilicon, wherein the oxide film is formed by applying an oxidizing chemical solution, wherein the oxidizing chemical solution comprises a mixture comprising $NH_4OH$, $H_2O_2$ and $H_2O$, and wherein the mixture has a ratio of around 1:1:5 to 1:2:7.

2. The method according to claim 1, wherein the applying of the oxidizing chemical solution occurs with the temperature of the oxidizing chemical solution around 70° to 80° C.

3. The method according to claim 1, wherein the forming of the oxide film causes the surface of the conductive plug to change from a hydrophobic state to a hydrophilic state.

4. A method for reducing surface defects of a semiconductor substrate, comprising:

selectively patterning an insulation film formed on an upper surface of a semiconductor substrate and forming a hole;

forming a conductive layer in the hole and on an upper surface of the insulation film;

performing a polishing process with slurry on the conductive layer to remove portions of the conductive layer to expose the upper surface of the insulating film and form a conductive layer plug which remains in the contact hole and also to simultaneously form an oxide film on the upper surface of the plug, wherein the polishing process is performed by using a slurry containing an oxidizing chemical solution comprising $NH_4OH$, $H_2O_2$ and $H_2O$; and washing the upper surface of the conductive layer plug and of the insulation film, wherein the polishing process is performed with the oxidizing chemical solution having a ratio of $NH_4OH:H_2O_2:H_2O$ of around 1:1:5 to 1:2:7.

5. The method according to claim 4, wherein the polishing process is performed at a temperature of around 70° to 80 C.

6. A method for reducing surface defects of a semiconductor substrate, comprising:

selectively patterning an insulation film formed on a semiconductor substrate to form at least one contact hole;

forming a conductive layer in the contact hole and on the insulation film;

polishing the conductive layer to remove a portion of the conductive layer and expose a surface of the insulation film thus forming a conductive layer plug which remains in the contact hole;

applying an $NH_4OH$, $H_2O_2$ and $H_2O$ mixture to the conductive layer plug after the polishing of the conductive layer step is completed to form an oxide film on the surface of the conductive plug, wherein the $NH_4OH$, $H_2O_2$ and $H_2O$ mixture is applied at a temperature of around 70° to 80° C.; and washing the oxide film and the insulation film.

7. The method according to claim 6, wherein the oxide film is formed separately from the polishing of the conductive layer step.

8. The method according to claim 6, wherein the forming of the conductive layer comprises applying polysilicon in the contact hole and on the insulation film.

9. The method according to claim 6, wherein the $NH_4OH$, $H_2O_2$ and $H_2O$ mixture has a ratio of 1:1:5 to 1:2:7.

10. The method according to claim 6, wherein the applying of the $NH_4OH$, $H_2O_2$ and $H_2O$ mixture causes the surface of the conductive plug to change from a hydrophobic state to a hydrophilic state.

* * * * *